United States Patent [19]
Glance et al.

[11] Patent Number: 5,450,431
[45] Date of Patent: Sep. 12, 1995

[54] DIGITALLY-TUNED INTERGRATED LASER WITH MULTI-FREQUENCY OPERATION

[75] Inventors: Bernard Glance, Colts Neck; Martin Zirngibl, Middletown, both of N.J.

[73] Assignee: AT&T Corp., Murray Hill, N.J.

[21] Appl. No.: 300,021

[22] Filed: Sep. 2, 1994

[51] Int. Cl.$^6$ .............................................. H01S 3/10
[52] U.S. Cl. ........................................ 372/50; 372/20; 372/26; 385/14
[58] Field of Search ................ 372/26, 50, 20; 385/14

[56] References Cited

U.S. PATENT DOCUMENTS 5,373,517 12/1994 Dragone et al. ...................... 372/20
5,390,200 2/1995 Zirngibl .................................. 372/20

Primary Examiner—James W. Davie

[57] ABSTRACT

A digitally-tuned integrated laser with multi-frequency operation for generating optical signals of various frequencies. The laser includes a wafer (10) having a frequency router (12) defined therein and a first cleaved face (20), a second cleaved face (24) and a third face (11). An active optical amplifier (18) is formed at the first cleaved face and is connected to the frequency router by a waveguide (14). A plurality of individually selectable optical amplifier pairs (22, 22') are formed at the second cleaved face (24) and are connected to the frequency router by pairs of waveguides (16, 16'). The waveguides of each pair are coupled one to the other by an optical coupler (28) that provides a portion of a generated optical signal to a modulator (26) contained in one of the waveguides of each waveguide pair.

6 Claims, 2 Drawing Sheets

DIGITALLY-TUNED INTERGRATED LASER WITH MULTI-FREQUENCY OPERATION

BACKGROUND OF THE INVENTION

I. Field of the Invention

This invention relates to optical communication systems. More particularly, the invention is directed to lasers used in optical communication systems for providing electromagnetic energy at many different frequencies.

II. Background Art

High capacity optical communication systems require that many optical signals be frequency division multiplexed in the components of an optical network. This requires that there be a way of conveniently producing electromagnetic energy at many different frequencies. An ideal device for producing optical energy useful in an optical communication system is a laser. Recently, such lasers have been constructed as substrates or wafers comprised of semiconductor material having a frequency router connected to active sections, comprised of optical amplifiers, and selective sections, also comprised of optical amplifiers. A laser of this type is for example disclosed in commonly-owned U.S. patent application Ser. No. 08/019,952, U.S. Pat. No. 5,373,517, entitled Rapidly Tuneable Integrated Laser, filed Feb. 19, 1993, and is depicted in FIG. 1 of the drawings.

The laser 5 of FIG. 1 is seen to include a substrate or wafer 10 having a first cleaved face 20 and a second cleaved face 24, and formed in a manner well known to those of ordinary skill in the art. An N×N frequency routing device 12 is formed in the wafer 10 between the faces 20 and 24. One side of the laser 5—the left side in FIG. 1—is formed of a plurality of active optical amplifiers defining active sections $18_1$ through $18_N$, each in contact with a corresponding waveguide in a first plurality of wave $14_1$ through $14_N$. The waveguides are, in turn, connected to the left side of the frequency router 12. For lasing, one of the optical amplifiers 18 (such as the optical amplifier $18_1$ in FIG. 1) is DC biased in its active region so as to become light-transmissive and to provide gain to the selected lased frequencies, as more fully explained below.

The other side of laser 5—the right side in FIG. 1—has a plurality of selectively activatable optical amplifiers or gates $22_1$ through $22_N$ which are placed at the second cleaved face 24 for forming a lasing path through which lasing occurs. Each selectively activatable optical amplifier 22 is connected to a corresponding one of the plurality of waveguides $16_1$ through $16_N$ which are connected to the frequency router 12, i.e. to the left side of the router 12 in FIG. 1. The laser 5 is operated by forming lasing paths between one of the waveguides 14 which are connected to a corresponding active optical amplifier 18, and one or more of the waveguides 16 which are connected to the corresponding selectively activatable optical amplifiers 22.

Each optical amplifier comprises a doped section having controllable optical transmissivity. The doping level is such that an appropriately configured semiconductor junction is defined in each optical amplifier. These doped sections are optically active in that an application of electrical energy to those sections will cause them to become transmissive to the flow of optical energy and will even provide some degree of gain to optical signals flowing through them. When electrical bias current above a lasing threshold is applied, laser action begins. The doped sections are substantially opaque to the transmission of light when no electrical stimulation is applied. However, when electrical stimulation is applied, these sections become light transmissive. Thus, for example, a lasing path is created by applying the appropriate electrical stimulation, i.e. an amount above the lasing threshold, to optical amplifier 18 and to any of the selectively activatable optical amplifiers such as the amplifiers $22_3$ and $22_6$.

The frequency router 12 is a bidirectional device capable of multiplexing and demultiplexing optical signals and also possesses a wraparound feature. For an optical signal having a frequency $F_1$ appearing on waveguide $14_1$ and flowing toward the router 12, the signal will be directed to the waveguide $16_1$. Conversely, an optical signal having a frequency $F_1$ directed toward the router 12 on waveguide $16_2$ will be directed by the router to the waveguide $14_1$. An optical signal having a frequency $F_2$ appearing on waveguide $14_1$ and flowing toward the router 12 will be directed to the waveguide $16_2$ and an optical signal having a frequency $F_2$ directed toward the router 12 on waveguide $16_2$ will be directed toward guide $14_1$. Thus, by way of illustration, for a four port frequency router 12 having a signal F comprised of four discrete frequency components $F_1$, $F_2$, $F_3$ and $F_4$ appearing on waveguide $14_1$, the router 12 will demultiplex and direct the individual frequency components to waveguides 16 such that component $F_1$ appears at waveguide $16_1$, component $F_2$ appears at waveguide $16_2$, etc.

In addition and as stated above, the router 12 contains a wraparound feature which is inherent to the device. Thus, for a signal F having discrete frequency components $F_1$, $F_2$, $F_3$ and $F_4$ appearing on waveguide $14_2$ and flowing toward the router 12, the components will be directed to waveguides 16 such that frequency component $F_1$ appears at waveguide $16_2$, frequency component $F_2$ appears at waveguide $16_3$, frequency component $F_3$ appears at waveguide $16_4$ and frequency component $F_4$ appears at waveguide $16_1$. In other words, if the signal F appears at a waveguide $14_2$ which provides the signal to the router one waveguide position below the position of waveguide $14_1$, each frequency component appears at a correspondingly shifted waveguide. In this example, the described router 12 contains only four waveguides $16_1$ through $16_4$. Thus, frequency component $F_4$ is wrapped around and routed to waveguide $16_1$.

When optical amplifier $22_3$ is activated by applying thereto an appropriate DC bias voltage, lasing at a frequency $F_3$ occurs through the lasing path defined by waveguide $16_3$, frequency router 12 and waveguide 14. The laser 5 is capable of operating at two or more simultaneous frequencies and generates a multiplexed output made up of the lased signals. Thus, as seen in FIG. 1, gate $22_6$ is also activated which generates lasing at frequency $F_6$ through a lasing path defined by waveguide $16_6$, frequency router 12, and waveguide $14_1$. The output signal accordingly contains frequencies $F_3$ and $F_6$. In operation, each frequency is modulated at a distinct rate (identified as $M_1$ and $M_2$ in FIG. 1), to provide data to the lased frequencies ($F_3$ and $F_6$), which data can be retrieved through known demodulation techniques.

While the prior art laser 5 of FIG. 1 is useful in optical communication systems because it is capable of operating at two or more simultaneous frequencies and generating a multiplexed output comprised of the multiple lased frequencies, the laser is nonetheless limited in several important respects. First, when such a laser is operated at two or more simultaneous frequencies, the output contains readily perceivable crosstalk. Second, because the modulation rate is related to the length of the lasing cavity, for the laser depicted in FIG. 1 the modulation rate is limited to about 150 Mb/s due to the relatively large size of the lasing path. This, of course, limits the amount of data that each frequency is capable of carrying. Thus, it would be desirable to have a digitally-tuned laser that is capable of operating at two or more simultaneous frequencies while eliminating crosstalk and appreciably increasing the attainable modulation rate.

SUMMARY OF THE INVENTION

The present invention is accordingly directed to a digitally-tuned integrated laser with multi-frequency operation. The laser comprises a wafer having a frequency router disposed between a first cleaved face and a second cleaved face and which defines a laser cavity. An active optical amplifier is formed at the first cleaved face for operation in an active mode. A waveguide connects the active optical amplifier to the frequency router.

The laser also includes a plurality of pairs of selectively activated optical amplifiers formed at the second cleaved face. Each pair of selectively activated amplifiers has a first and a second optical amplifier, the second amplifier of each pair being selectively activatable by a control signal. A plurality of waveguide pairs, each pair comprising first and second waveguides, are connected to the selectively activated amplifiers so that the second waveguide of each pair is connected to the corresponding second optical amplifier, thereby defining a lasing path for the generated signal, and the first waveguide of each pair is connected to the corresponding first optical amplifier. Means for optically coupling a respective first waveguide of each waveguide pair to its corresponding second waveguide are provided for splitting the selected lasing frequency into first and second portions with the first portions being directed to corresponding first waveguides of the waveguide pairs and the second portions being directed to corresponding second waveguides of the waveguide pairs. Means are also provided for modulating the first portions of the selected lasing frequency and then providing the modulated portions to the frequency router which directs the modulated portions to an output port.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PREFERRED EMBODIMENT

Figure 1:
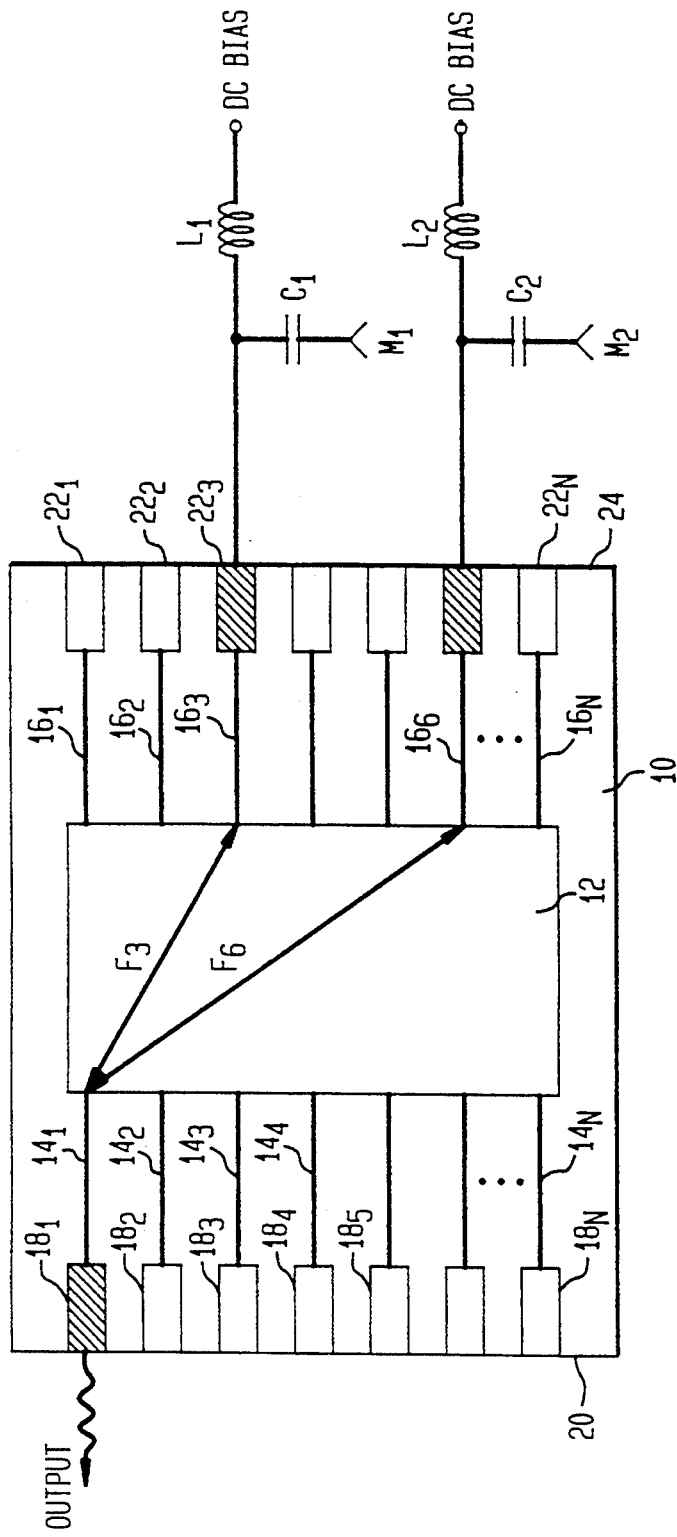
FIG. 1 is a block schematic diagram of a prior art digitally-tuned laser.
Figure 2:
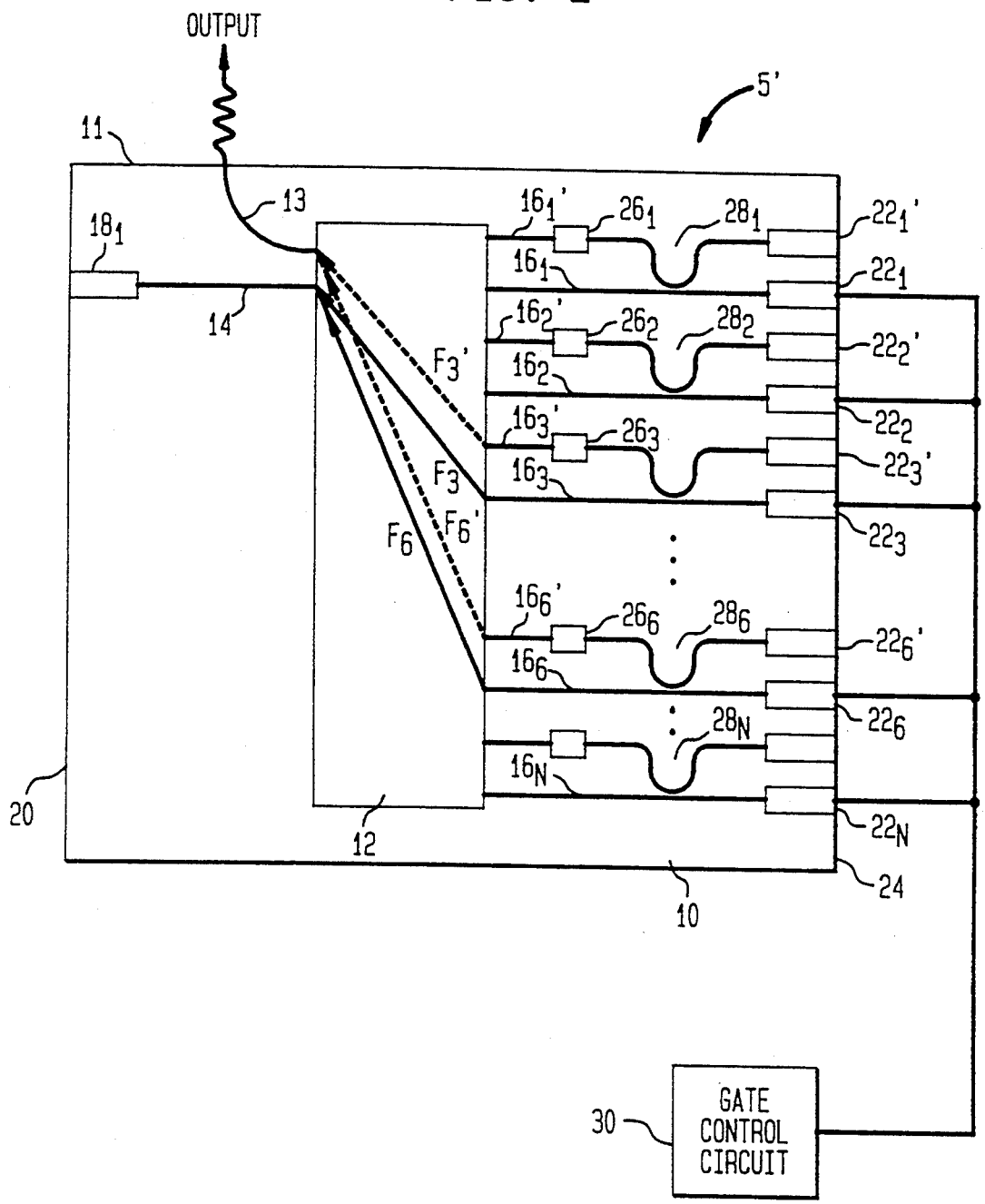
FIG. 2 is a block schematic diagram of an improved digitally-tuned laser constructed in accordance with the teachings of the present invention.

FIG. 2 of the drawings depicts an improved digitally-tuned laser $5'$ with multifrequency operation that is constructed in accordance with the present invention. The laser $5'$, like the prior art laser 5 of FIG. 1, is formed in a substrate or wafer 10 having a first cleaved face 20 and a second cleaved face 24, and further includes a third face 11 which is preferably substantially perpendicular to the cleaved faces 20 and 24. As explained above, in respect of the prior art construction, for lasing to occur only one of the amplifiers 18 of FIG. 1 is biased in the active mode. For this reason, FIG. 2 depicts a single optical amplifier 18 which is disposed at or proximate the first cleaved face 20. Optical amplifier 18 is connected to a corresponding waveguide 14 which, in turn, is connected to a $2 \times 2N$ frequency router 12. An additional waveguide 13 is also included which is connected to frequency router 12. As in the prior art laser of FIG. 1, the optical amplifier 18 restricts the flow of optical energy, or light, when biased below a threshold lasing voltage and allows the flow of optical energy when biased above the threshold lasing voltage.

Unlike that of the prior art laser 5, the right side of the inventive laser $5'$ depicted in FIG. 2 includes a plurality of pairs of optical amplifiers or gates 22, with each pair comprising a modulated path optical amplifier $22_1'$ through $22_N'$ and a selectively activatable optical amplifier or gate $22_1$ through $22_N$. Thus, the first pair of optical amplifiers is formed of the selectively activatable gate $22_1$ and the modulated path amplifier $22_1'$, the second pair is formed of the selectively activatable gate $22_2$ and modulated path amplifier $22_2'$, and so on. Each gate 22 is connected to a corresponding waveguide $16_1$ through $16_N$ which collectively form a plurality of waveguides, and each modulated path optical amplifier $22'$ is connected to a corresponding modulated waveguide $16_1'$ through $16_N'$ which likewise form a plurality of modulated waveguides, as shown in FIG. 2.

Each selectively activatable optical amplifier or gate $22_1$ through $22_N$ is responsive to a control signal generated from a gate control circuit 30 for selecting which of the gates $22_1$ through $22_N$ is to be activated, thereby determining at which frequency lasing will occur. As the gates are only light transmissive when biased in an active mode, i.e. when a control signal exceeding the lasing threshold is applied, and because amplifier 18 is always biased in the active mode, lasing will occur at a particular frequency when the corresponding gate is selected by the gate control circuit 30. Thus, if gate $22_3$ is activated, a lasing path defined by waveguide $16_3$, router 12 and waveguide 14 is formed and lasing occurs at frequency $F_3$.

With continued reference to FIG. 2, each modulated waveguide $16'$ comprises an optical coupler 28 and a modulator 26. The optical coupler joins each modulated waveguide $16'$ to its corresponding waveguide 16. Thus, optical coupler $28_1$ couples waveguide $16_1$ to modulated waveguide $16_1'$, optical coupler $28_2$ couples waveguide $16_2$ to modulated waveguide $16_2'$, and so on. The modulator 26 of each modulated waveguide $16'$ is disposed in-line with the modulated waveguide $16'$ to modulate a portion of the selected lasing frequency, as more fully described below. Also as shown, the signal on the modulated waveguide $16'$ is supplied to the frequency router 12 at a port different than the port connected to the waveguide 16.

To produce laser light at one of N discrete frequencies, such for example as the frequencies F3 and F6 in FIG. 2, the gate control circuit 30 supplies a control signal in the form of a bias current to gates $22_3$ and $22_6$. This activates the lasing paths through which laser light having frequencies F3 and F6 are generated, resulting in a lasing path for frequency F6 between gate $22_6$ and active optical amplifier 18, and a lasing path for frequency F3 between gate $22_3$ and active optical amplifier 18.

When gates $22_3$ and $22_6$ are activated by the control signal from circuit 30, the optical couplers $28_3$ and $28_6$ respectively connected thereto split a portion of the signal on the corresponding waveguides $16_3$ and $16_6$ and direct them to the corresponding modulators $26_3$ and $26_6$ which modulate the signal at a predetermined rate and provide the so modulated signals to the frequency router 12 via modulated waveguides $16_3'$ and $16_6'$. Thus, optical coupler $28_3$ splits a portion of the optical signal having frequency F3, which is then modulated at a rate of M3 by modulator $26_3$ and supplied to the frequency router 12 via modulated input waveguide $16_3'$. The modulated frequency is depicted in FIG. 2 as the broken or dashed line $F_3'$. A like process occurs for the optical signal of frequency F6. In other words, the signal F6 is coupled via optical coupler $28_6$, is modulated at a rate of M6 by modulator $26_6$ and is supplied to frequency router 12. The modulated frequency F6 is depicted in FIG. 2 as the broken or dashed line $F_6'$.

As mentioned above, since the modulated signals are supplied to the frequency router 12 one port position above the unmodulated signals, the modulated multiplexed signal comprised of the selected modulated discrete frequency components is likewise directed to waveguide 13 which is different and, in fact, one port above the waveguide containing the unmodulated signals; i.e. waveguide 14. In the preferred embodiment, the waveguide 13 is combined and/or oriented to direct the generated signal to the third face 11 of wafer 10, which face 11 is coated with an anti-reflection material to further maximize the output signal. In addition, as the unmodulated signal is no longer needed, the cleaved faces 22 and 24 are coated with a high reflection material to prevent or impede passage of the unmodulated optical signals. It is also noted that as the modulated path optical amplifiers 22' are not operated in the active mode and are therefore light absorptive, these amplifiers reduce degenerative feedback in the laser 5' because the amplifiers 22' absorb the portions of the optical signals which may be fed back through the optical couplers 28.

As will now be appreciated, the laser 5' of the present invention does not modulate the generated lased optical signals within the lasing path (as in the prior art arrangement of in FIG. 1) but, instead, operatively employs a plurality of internal modulators 26 formed on the wafer 10 for modulating a portion of the lased signal outside of the lasing path. As such, the limiting relationship between the modulation rate and the length of the lasing cavity in prior art digitally-tuned lasers is not present in lasers constructed in accordance with the present invention, thereby permitting the realization and use of faster modulation rates. In addition, the laser configuration of the present invention eliminates the crosstalk that was present when the prior art laser of FIG. 1 was operated at two or more simultaneous frequencies.

While there have been shown and described and pointed out fundamental novel features of the invention as applied to a currently preferred embodiment thereof, it will be understood that various omissions and substitutions and changes in the form and details of the apparatus illustrated, and in its operation, may be made by those skilled in the art without departing from the spirit of the invention. It is the intention, therefore, to be limited only as indicated by the scope of the claims appended hereto.

What is claimed is:

1. A digitally-tuned integrated laser with multi-frequency operation for generating an optical signal, said laser comprising:

a wafer having a first cleaved face and a second cleaved face for defining a laser cavity:

a frequency router formed in said wafer;

an optical amplifier formed at said first cleaved face for operation in an active mode;

a first pair of waveguides comprising a first waveguide and a second waveguide, said second waveguide connecting said optical amplifier to said frequency router;

a pair of optical amplifiers formed at said second cleaved face, said pair comprising first and second optical amplifiers, said second amplifier being selectively activatable by a control signal;

a second pair of waveguides comprising a first waveguide and a second waveguide, said second waveguide being connected to said second optical amplifier, thereby defining a lasing path for the generated optical signal;

means for optically coupling the first waveguide of said second pair of waveguides to the second waveguide of said second pair of waveguides for splitting the generated optical signal into first and second portions respectively directed to said first and second waveguides in said second pair of waveguides so as to provide paths between said optical amplifier pair and said frequency router for the first and second portion of said generated optical signal for applying the first and second portions of the generated optical signal to said frequency router; and means for modulating said first portion of the optical signal before said portion is applied to said router, to define a modulated first portion of the generated optical signal which is directed to said first waveguide of said first pair of waveguides by said frequency router.

2. The laser of claim 1, wherein said wafer further comprises a third face substantially parallel to said second cleaved face, and wherein said first waveguide of said first pair of waveguides connects said third face to said frequency router.

3. The laser of claim 2, wherein said first and second cleaved faces are coated with a high reflection material and wherein said third face is coated with an anti-reflection material.

4. A digitally-tuned integrated laser with multi-frequency operation for generating optical signals of various frequencies, said laser comprising:

a wafer having a first cleaved face and a second cleaved face for defining a laser cavity:

a frequency router formed in said wafer;

an optical amplifier formed at said first cleaved face for operation in an active mode;

a pair of waveguides comprising a first waveguide and a second waveguide, said second waveguide connecting said optical amplifier to said frequency router;

a plurality of pairs of optical amplifiers formed at said second cleaved face, each said pair comprising first and second optical amplifiers, and said second amplifiers of each said pair being selectively activatable by a control signal;

a plurality of waveguide pairs, each said waveguide pair comprising a first waveguide and a second waveguide, said second waveguide of each said waveguide pair being connected to a corresponding one of said second optical amplifiers, thereby defining a lasing path for the generated optical signals;

means for optically coupling the first waveguide of each said waveguide pair to said second waveguide of said each said waveguide pair for splitting the generated optical signals into first and second portions respectively directed to said corresponding first and second waveguides of said each said waveguide pair so as to provide paths for the first and second portions of said generated optical signals between said plurality of optical amplifier pairs and said frequency router for applying the first and second portions of the generated optical signals to said frequency router; and means for modulating said first portions of said generated optical signals before said portions are applied to said frequency router to define modulated first portions of said generated optical signal which are directed to said first waveguide of said pair of waveguides by said frequency router.

5. The laser of claim 4, wherein said wafer further comprises a third face substantially parallel to said second cleaved face, and wherein said first waveguide of said pair of waveguides connects said third face to said frequency router.

6. The laser of claim 5, wherein said first and second cleaved faces are coated with a high reflection material and wherein said third face is coated with an anti-reflection material.

* * * * *